US009078380B2

(12) United States Patent
Xu

(10) Patent No.: US 9,078,380 B2
(45) Date of Patent: Jul. 7, 2015

(54) MOSFET STACK PACKAGE

(71) Applicant: NVIDIA CORPORATION, Santa Clara, CA (US)

(72) Inventor: Shuang Xu, Shenzhen (CN)

(73) Assignee: NVIDIA CORPORATION, Santa Clara, CA (US)

( * ) Notice: Subject to any disclaimer, the term of this patent is extended or adjusted under 35 U.S.C. 154(b) by 157 days.

(21) Appl. No.: 13/655,830

(22) Filed: Oct. 19, 2012

(65) Prior Publication Data

US 2014/0111952 A1 Apr. 24, 2014

(51) Int. Cl.
*H01L 25/00* (2006.01)
*H03F 1/00* (2006.01)
*H01L 29/08* (2006.01)
*H05K 3/30* (2006.01)

(52) U.S. Cl.
CPC .............. *H05K 3/30* (2013.01); *Y10T 29/4913* (2015.01); *H01L 25/00* (2013.01); *H01L 2924/0002* (2013.01)

(58) Field of Classification Search
CPC ............ H03F 1/223; H01L 2924/13091
USPC .................... 361/777, 748; 29/832
See application file for complete search history.

(56) References Cited

U.S. PATENT DOCUMENTS

| | | | | |
|---|---|---|---|---|
| 5,297,107 | A * | 3/1994 | Metzger et al. | ............... 361/778 |
| 5,929,520 | A | 7/1999 | Nerone | |
| 5,994,166 | A * | 11/1999 | Akram et al. | ................. 438/108 |
| 5,998,864 | A * | 12/1999 | Khandros et al. | ............. 257/723 |
| 6,434,016 | B2 * | 8/2002 | Zeng et al. | ..................... 361/760 |
| 6,680,529 | B2 | 1/2004 | Chen et al. | |
| 7,183,616 | B2 | 2/2007 | Bhalla et al. | |
| 7,199,458 | B2 | 4/2007 | Lee | |
| 7,199,459 | B2 | 4/2007 | Pu et al. | |
| 7,271,477 | B2 * | 9/2007 | Saito et al. | ..................... 257/686 |
| 7,485,508 | B2 * | 2/2009 | Dyer et al. | ..................... 438/154 |
| 7,492,043 | B2 * | 2/2009 | Choi et al. | ..................... 257/724 |
| 7,786,604 | B2 | 8/2010 | Tai | |
| 7,846,779 | B2 | 12/2010 | Yang | |
| 7,985,991 | B2 | 7/2011 | Kajiwara et al. | |
| 8,022,523 | B2 * | 9/2011 | Chen et al. | ..................... 257/686 |
| 8,022,537 | B2 * | 9/2011 | Akamine et al. | ............. 257/728 |
| 8,030,743 | B2 | 10/2011 | Liu et al. | |
| 8,089,139 | B2 | 1/2012 | Shi et al. | |
| 8,124,453 | B2 | 2/2012 | Sun et al. | |
| 8,143,720 | B2 * | 3/2012 | Lambrecht | ..................... 257/723 |
| 8,168,477 | B2 | 5/2012 | Sun et al. | |
| 8,217,503 | B2 | 7/2012 | Ho et al. | |
| 8,399,983 | B1 * | 3/2013 | New | .............................. 257/698 |
| 8,451,621 | B2 * | 5/2013 | Krishnan et al. | .............. 361/790 |

(Continued)

FOREIGN PATENT DOCUMENTS

JP 2000030878 A * 1/2000 ............. H05B 41/02

*Primary Examiner* — Jeremy C Norris
*Assistant Examiner* — Nathan Milakovich
(74) *Attorney, Agent, or Firm* — Artegis Law Group, LLP

(57) ABSTRACT

Embodiments of the invention provide methods and configuration for packaging multiple semiconductor ships in a semiconductor package. In one embodiment, an integrated circuit system includes a printed circuit board, a first MOSFET device disposed on a first surface of the printed circuit board, and a second MOSFET device disposed on a second surface of the printed circuit board, wherein the first MOSFET device overlaps an edge of the second MOSFET device in a direction extending through the printed circuit board.

20 Claims, 2 Drawing Sheets

(56) References Cited

U.S. PATENT DOCUMENTS

| | | |
|---|---|---|
| 2007/0085187 A1 | 4/2007 | Sun et al. |
| 2009/0127676 A1* | 5/2009 | Gomez ............ 257/666 |
| 2009/0128968 A1* | 5/2009 | Lu et al. ............ 361/56 |
| 2010/0265682 A1* | 10/2010 | Martinez et al. ............ 361/782 |
| 2011/0143499 A1* | 6/2011 | Sun et al. ............ 438/109 |
| 2011/0193208 A1 | 8/2011 | Xue et al. |
| 2011/0266683 A1* | 11/2011 | Feng ............ 257/773 |
| 2013/0265726 A1* | 10/2013 | Murai et al. ............ 361/748 |

* cited by examiner

MOSFET STACK PACKAGE

BACKGROUND OF THE INVENTION

1. Field of the Invention

Embodiments of the invention relate to the process and configuration for packaging integrated circuits, such as power MOSFETs and other types of integrated circuits. More particularly, the present invention relates to process and configuration for packaging metal-oxide semiconductor field effect transistor (MOSFET) or IC device process with reduced manufacture cost and improved electrical performance.

2. Description of the Related Art

The dimensions of the state of the art electronic devices are ever decreasing. To reduce the dimensions of electronic devices, the structures by which the microprocessors, memory devices, and other semiconductor devices are packaged and assembled with circuit broads to be more compact.

In the packaging of integrated circuit chips, typically, a plurality of semiconductor chips are desired to be put into one semiconductor package in order to maximize electrical current performance. There are ever-increased demands to improve upon the conventional device layout and packaging configurations implemented for power MOSFETs to achieve faster switching with reduced power dissipation when the MOSFETs are used for higher frequency operation. Conventionally, a stacked semiconductor package may include vertically stacking two semiconductor chips vertically on one side of a printed circuit board are utilized to prove the integrity of the performance of the semiconductor package.

In response to the desire for high speed switching and lower power consumption, a greater number of the semiconductor chips are preferred to be assembled in a single semiconductor package. However, assembling a large number of semiconductor chips assembled in single a semiconductor package often results in increased package size, which may adversely increase manufacturing cost and takes up more undesirable surface area of the printed circuit board (PCB).

Therefore, there is a need in the art to economically package multiple semiconductor chips in a give size of a semiconductor package with minimum cost while maintaining compatible package size.

SUMMARY OF THE INVENTION

Embodiments of the invention provide methods and configuration for packaging multiple semiconductor ships in a semiconductor package. In one embodiment, an integrated circuit system includes a printed circuit board, a first MOSFET device disposed on a first surface of the printed circuit board, and a second MOSFET device disposed on a second surface of the printed circuit board, wherein the first MOSFET device overlaps an edge of the second MOSFET device in a direction extending through the printed circuit board.

In another embodiment, an integrated circuit system includes a first MOSFET device disposed on a first surface of a printed circuit board, and a second MOSFET device electrically connected to the first MOSFET device through the printed circuit board, the second MOSFET device disposed on a second surface opposite the first surface of the printed circuit board, wherein the second MOSFET device is positioned at a location offset from a center of the first MOSFET device.

In yet another embodiment, a method for manufacturing an integrated circuit system includes providing a first MOSFET device electrically connected to a second MOSFET each disposed on opposite sides of a printed circuit board, and providing a third MOSFET device electrically connected to the second MOSFET disposed on an opposite where the second MOSFET is disposed, wherein the second MOSFET device is positioned at a location offset from a center of the first MOSFET device and the third MOSFET device is positioned at a location offset from a center of the second MOSFET device.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings.

To facilitate understanding, identical reference numerals have been used, where possible, to designate identical elements that are common to the figures. It is contemplated that elements disclosed in one embodiment may be beneficially utilized on other embodiments without specific recitation.

It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide processes and configurations for packaging multiple semiconductor chips in a semiconductor package onto a printed circuit board (PCB). In one embodiment, multiple semiconductor chips may be assembled on both sides of the PCB so as to maximize the numbers of the semiconductor chips packaged in a semiconductor package. By doing so, multiple semiconductor chips may be assembled on both side of a PCB within a given size and dimension on the PCB board with improved electrical performance.

Figure 1:
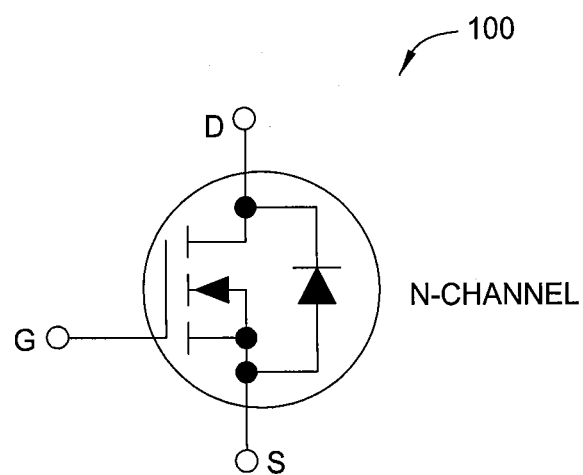
FIG. 1 depicts one embodiment of a circuit diagram of a MOSFET device in accordance with one embodiment of the present invention.

FIG. 1 depicts one embodiment of a circuit diagram of a MOSFET device 100 in accordance with one embodiment of the present invention. The MOSFET device 100 comprises an N-channel enhancement mode device, called a n-type MOSFET device. The MOSFET device 100 includes a drain electrode D, a source electrode S and a gate electrode. The source electrode S is electronically connected to the gate electrode G. The gate electrode G is electronically connected to a drain electrode D. The gate electrode G may be connected to a controller (not shown). The drain electrode D may be connected to a power input $V_{in}$ end. The source electrode S may be connected to a $G_{nd}$ end, composing the MOSFET device 100.

Figure 2:
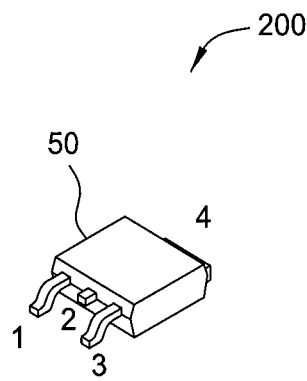
FIG. 2 depicts a pin layout of a semiconductor package with a MOSFET device of FIG. 1 in accordance with one embodiment of the present invention.

FIG. 2 depicts a pin layout of a semiconductor package 200 with a MOSFET device 100 of FIG. 1 packaged therein in accordance with one embodiment of the present invention. The drain electrode D may be connected to the power input $V_{in}$ via pins 2 and 4 in the semiconductor package 200. The source electrode S may be connected to the $G_{nd}$ end via pin 1. The gate electrode G may be connected to a controller via pin 1. The connection between the source electrode S and the drain electrode D is within an encapsulating case 50. The encapsulating case 50 encapsulates the source, drain and gate electrode S, D, G. Wires may be utilized to connect the pins 1, 2, 3, 4 onto a PCB board, which will be discussed below with Referenced to FIGS. 3-4.

Figure 3:
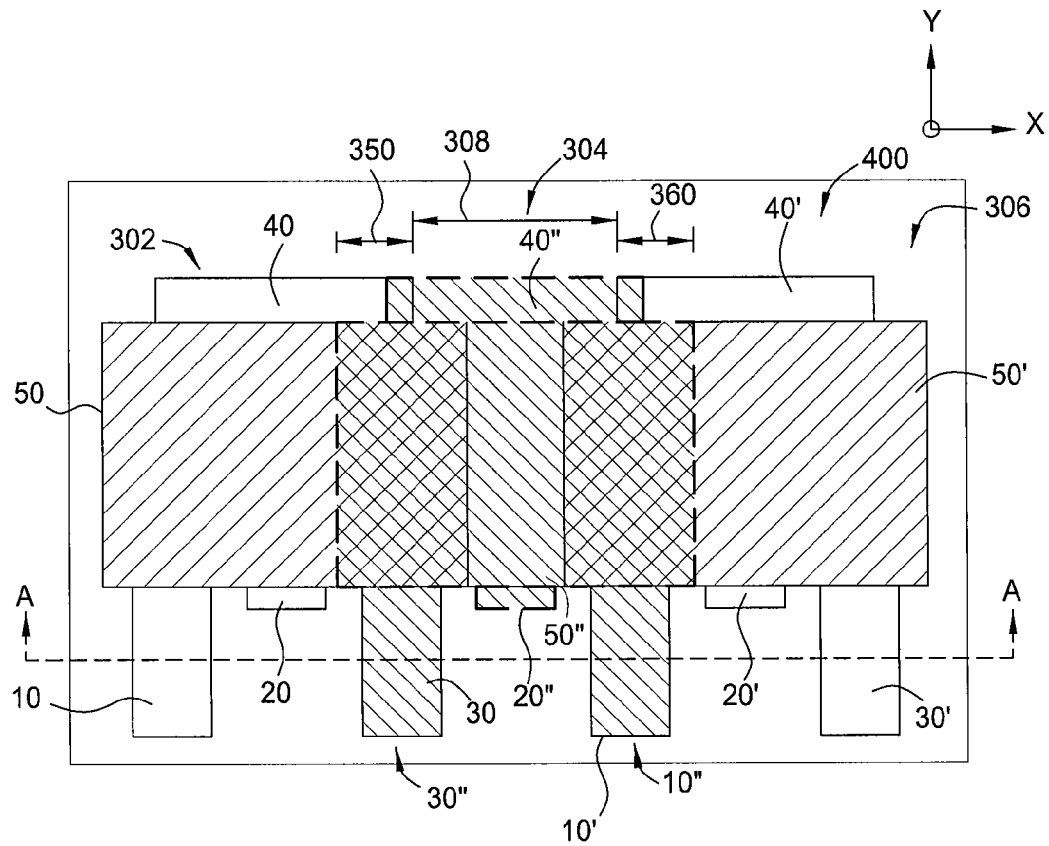
FIG. 3 depicts a top view of multiple semiconductor chips assembled onto a printed circuit board (PCB) in accordance with one embodiment of the present invention.
Figure 4:
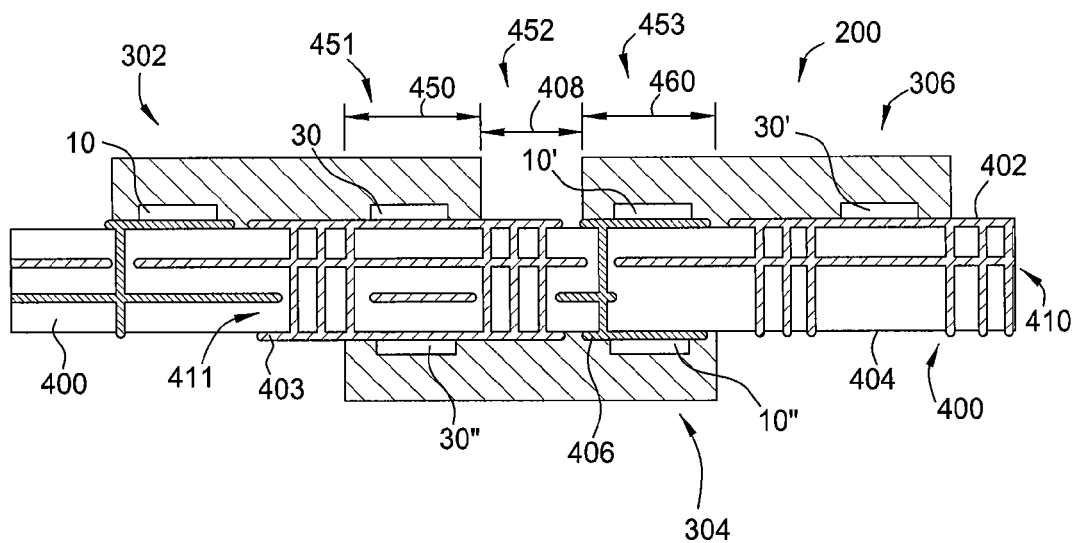
FIG. 4 depicts a cross sectional of multiple semiconductor chips assembled onto a printed circuit board (PCB) along the cut away line A-A' depicted in FIG. 3 in accordance with one embodiment of the present invention.

FIG. 3 depicts a top view of multiple semiconductor chips containing MOSFET devices assembled onto a printed circuit board (PCB) 400 in accordance with one embodiment of the present invention. In the exemplary embodiment depicted in FIG. 3, a first, a second and a third MOSFET device 302, 304, 306 are disposed on different sides of the PCB 400. It is noted that the MOSFET devices 302, 304, 306 are similarly configured as the MOSFET device 100 depicted in FIG. 1 and the MOSFET device 100 disposed in the semiconductor package 200 depicted FIG. 2. The number of the MOSFET devices may be varied, increased or decreased as needed to achieve different electrical performance requirements. The first MOSFET device 302 is positioned in parallel to the third MOSFET device 306 in a side-by-side configuration on a first surface 402 of a PCB 400 (as shown in FIG. 4). It is noted that the MOSFET devices 302, 304, 306 are positioned in parallel to a x-y plane of the PCB 400. The first and the third MOSFET devices 302, 306 are both assembled on a same side of the PCB 400. The third MOSFET device 306 is positioned offset from a center of the first MOSFET device 302. By arranging the first and the third MOSFET devices 302, 306 in parallel in a side-by-side configuration, the gate resistance is reduced to about half of that of an individual MOSFET. As the first MOSFET device 302 and third MOSFET device 306 are separated at a predetermined width 308, the heat dissipated may be spread more evenly over the package area to reduce local heat accumulation. This arrangement simultaneously allows for minimum gate resistance and source inductance and better thermal spreading.

In one embodiment, the first MOSFET device 302 and the third MOSFET device 306 both respectively have the gate electrode pin 10, 10', the source electrode pin 30, 30', and a first end of the drain electrode pins 40, 40' and a second end of the drain electrode pins 20, 20', similarly configured as the MOSFET device 100 depicted in FIG. 1 and the MOSFET device 100 disposed in the semiconductor package 200 depicted FIG. 2. The gate electrode pins 10, 10', the source electrode pins 30, 30' and the drain electrode pins 40, 40' are bonded to the PCB 400 through electrically conductive bonding wires, metallic balls, or any other suitable bonding techniques.

The encapsulating cases 50, 50' encapsulate the source electrode, drain electrode and gate electrode and only expose the gate electrode pins 10, 10', the source electrode pins 30, 30' and the drain electrode pins 40, 40' for wire bonding. The encapsulating case 50, 50' is configured to have a surface that is coplanar to the surface of the MOSFET devices so as to improve the structural integrity.

The first MOSFET device 302 and the third MOSFET device 306 may also be electrically interconnected by interchip electrically conductive gate wires (not shown) through the gate electrodes 10, 10'. Similarly, interchip electrically conductive source wires and drain wires may also be used to electrically interconnect the first MOSFET device 302 and the third MOSFET device 306 as need.

In one embodiment, the second MOSFET device 304 may be assembled onto a second surface 404, an opposite side wherein the first and the third MOSFET devices 302, 306 are assembled, of the PCB 400 (as shown in FIG. 4). The second MOSFET device 304 may have a similar device structure to the first and the third MOSFET device 302, 306 assembled on the PCB 400. The second MOSFET device 304 is positioned in parallel to the first and the third MOSFET device 302, 306 in a side-by-side configuration in parallel to a x-y plane of the PCB 400. The second MOSFET device 304 overlaps an edge of the first MOSFET device 302 and the third MOSFET 306 and is offset from a center of the first and the third MOSFET device 302, 306. The second MOSFET device 304 is electrically connected to the first and third MOSFET device 302, 306 in a direction through the PCB 400. By assembling the second MOSFET device 304 on the second surface 404 of the PCB 400, short electrical path may be obtained through the PCB 400 so that only short wiring distance needs to be wired.

The second MOSFET devices 304 assembled on the second surface 404 of the PCB 400 may assist further reducing gate resistance and improve the power and current density and switching speed. By utilizing the second MOSFET 304 assembled on another side of the PCB 400, higher electrical performance of the devices may be obtained while maintaining the devices within the same given size on the PCB 400 without adversely increasing a surface area of the substrate package.

The second MOSFET device 304 is assembled in a position between the first and the third MOSFET devices 302, 306 providing sufficient space to spread thermal energy generated during operation so as to provide minimum local heat accumulation while maintaining good electrical interconnection to the first and the third MOSFET devices 302, 306. In one embodiment, the second MOSFET device 304 is assembled between the first and the third MOSFET devices 302, 306 overlapping an edge, e.g., a portion, of the first and the third MOSFET devices 302, 306 respectively disposed on the other side of the PCB 400. In one embodiment, the second MOSFET device 304 is assembled on the other side of the PCB 400 to where the first and the third MOSFET devices 302, 306 are assembled having a first predetermined width 350 between about 0.5 mm and about 2 mm to the first MOSFET device 302 and a second predetermined width 360 between about 0.5 mm and about 2 mm to the second MOSFET device 304. Alternatively, the second MOSFET device 304 may also be configured to have about between about 10 percent and about 40 percent overlapping with the first MOSFET device 302 and between about 10 percent and about 40 percent overlapping with the third MOSFET device 306.

In one embodiment, similarly configured, the second MOSFET device 304 also has a gate electrode pin 10", a source electrode pin 30" and a first end of a drain electrode pin 40" and a second end of the drain electrode pin 20". The source electrode pin 30" of the second MOSFET device 304 may be electronically connected to the source electrode pin 30 of the first MOSFET device 302. The gate electrode pin 10" of the second MOSFET device 304 may be electronically connected to the gate electrode pin 10' of the third MOSFET device 306 or vice versa. The pins of the first, second and the third MOSFET devices 302, 304, 306 may be electronically connected by a number of electrically conductive bond wires, metal joint plate, or metal ribbons as needed.

FIG. 4 depicts a cross sectional view of multiple MOSFET devices 302, 304, 306 assembled onto a printed circuit board (PCB) 400 taken along section line A-A' depicted in FIG. 3. The PCB 400 has a first surface 402 and a second surface 404. The first surface 402 is adapted to have the first and the third MOSFET devices 302, 306 assembled thereon, while the second surface 404 is adapted to have the second MOSFET device 304 be assembled thereon, or vise versa. The PCB 400 has a gate drive plate 406 electroplated to a laminated board 410, e.g., a body of the printed circuit board (PCB) 400, configured to electrically connect to the gate electrode pins 10, 10', 10" of the MOSFET devices 302, 304, 306. The gate drive plate 406 has a plurality of electrically conductive via connected filled with conductive materials, such as copper, therein to connect to the first surface 402. The gate drive plate 406 is configured to electrically connect the gate electrode pins 10, 10', 10" among the MOSFET devices 302, 304, 306 assembled in a substrate package.

A ground plate 403 is also electroplated to the laminated board 410 configured to attach the source pins of the MOSFET devices 302, 304, 306 to ground. The ground plate 403 has a plurality of interlayer electrically conductive via connectors 411 filled with copper therein. Details of the inter-layer electrically conductive via connectors 411 are not explicitly shown for the sake of brevity. The inter-layer electrically conductive via connectors 411 provide electrical connection to the MOSFET devices 302, 304, 306 disposed between the surfaces 402, 404 of the PCB 400.

As shown in FIG. 4, the first and third MOSFET devices 302, 306 are formed on the first surface 402 of the PCB 400 and the second MOSFET device 304 is formed on the second surface 404 of the PCB 400. By utilizing MOSFET devices 302, 304, 306 mounted to both surfaces 402, 404 of the PCB 400, more MOSFET devices may be assembled within a given package size with improved electrical performance without adversely occupying more space on the PCB 400. In one embodiment, as described above, the source electrode pin 30 of the first MOSFET device 302 is electrically connected to the source electrode pin 30" of the second MOSFET device 304 through the ground plate 403 embedded in the PCB 400. The gate electrode pin 10" of the second MOSFET device 304 is electrically connected to the gate pin 10' of the third MOSFET device 306 through the gate drive plate 406 embedded in the PCB 400. The first MOSFET device 302 overlaps an edge of the second MOSFET device 304 and has an area 451 with the second MOSFET device 304 disposed on the opposite of the PCB 400. In one embodiment, the area 451 has the width 450 between about 1 mm and about 4 mm. The third MOSFET device 306 overlaps an edge of the second MOSFET device 304 and has an overlapping area an area 453 with the second MOSFET device 304 disposed on the opposite of the PCB 400. In one embodiment, the area 453 has the width 460 between about 1 mm and about 4 mm. The first MOSFET device 302 and the third MOSFET device 306 are disposed space-apart on the same side of the PCB 400 with a predetermined distance 452. The predetermined distance 452 has the width 408 between about 0.5 mm and about 3 mm. The above described layout having desired distance defined between the first, the second and the third MOSFET devices 302, 304, 306, thermal dissipation is enhanced with minimum undesired thermal accumulation during operation while improving electrical performance.

Furthermore, certain features of the packaging configuration may be arranged so as to define a placement rule to maximize the number of MOSFET devices being packaged with reduced package resistance and inductance. For example, an allowable aspect ratio of the encapsulating cases 50, 50' is between about 1 and about 2. This packaging feature improves the ability to space out the gate, source or drain bond wires.

While the foregoing is directed to embodiments of the invention, other and further embodiments of the invention may be devised without departing from the basic scope thereof.

What is claimed is:

1. An integrated circuit system, comprising:
   a printed circuit board;
   a first MOSFET device disposed on a first surface of the printed circuit board;
   a second MOSFET device disposed on a second surface of the printed circuit board, wherein the first MOSFET device overlaps an edge of the second MOSFET device in a direction extending through the printed circuit board, and wherein a source electrode pin of the first MOSFET device is aligned to be directly opposite from a source electrode pin of the second MOSFET device; and
   a third MOSFET device disposed on the first surface of the printed circuit board, wherein the second MOSFET device overlaps an edge of the third MOSFET device, and wherein a gate electrode pin of the second MOSFET device is aligned to be directly opposite from a gate electrode pin of the third MOSFET device.

2. The integrated circuit system of claim 1, wherein the first MOSFET device is aligned in parallel to the second MOSFET device.

3. The integrated circuit system of claim 1, wherein the third MOSFET device is aligned in parallel to the first MOSFET device.

4. The integrated circuit of claim 3, wherein the third MOSFET and the first MOSFET are positioned in a side-by-side configuration.

5. The integrated circuit system of claim 3, wherein the first and the third MOSFET devices are separated by a distance between about 0.5 mm and about 3 mm.

6. The integrated circuit system of claim 2, wherein the second and the third MOSFET devices are overlapped by a distance between about 1 mm and about 4 mm.

7. The integrated circuit system of claim 1, wherein the source electrode pin of the first MOSFET device is configured to electrically connect to the source electrode pin of the second MOSFET device.

8. The integrated circuit system of claim 3, wherein the gate electrode pin of the second MOSFET device is configured to electrically connect to the gate electrode pin of the third MOSFET device.

9. The integrated circuit system of claim 1, wherein the second MOSFET device is positioned offset from a center of the first and the third MOSFET devices.

10. The integrated circuit system of claim 1, wherein the first MOSFET device is electrically connected to the second MOSFET device through a plurality of electrical conductive vias formed in the printed circuit board.

11. An integrated circuit system, comprising:
    a first MOSFET device disposed on a first surface of a printed circuit board;
    a second MOSFET device electrically connected to the first MOSFET device through the printed circuit board, the second MOSFET device disposed on a second surface opposite the first surface of the printed circuit board, wherein the second MOSFET device is positioned at a location offset from a center of the first MOSFET device and the second MOSFET device overlaps an edge of the first MOSFET device, and wherein a source electrode pin of the first MOSFET device is aligned to be directly opposite from a source electrode pin of the second MOSFET device; and
    a third MOSFET device, disposed on the first surface of the printed circuit board, wherein the second MOSFET device overlaps an edge of the third MOSFET device, and wherein a gate electrode pin of the second MOSFET device is aligned to be directly opposite from a gate electrode pin of the third MOSFET device.

12. The integrated circuit system of claim 11, further comprising:
the third MOSFET device disposed adjacent to the first MOSFET device on the first surface of the printed circuit board, wherein the first and the third MOSFET devices are positioned in a side-by-side configuration.

13. The integrated circuit system of claim 11, wherein the source electrode pin of the first MOSFET device is configured to electrically connect to the source electrode pin of the second MOSFET device.

14. The integrated circuit system of claim 12, wherein the gate electrode pin of the second MOSFET device is configured to electrically connect to the gate electrode pin of the third MOSFET device.

15. The integrated circuit system of claim 11, wherein the first MOSFET device is electrically connected to the second MOSFET device through a plurality of electrical conductive vias formed in the printed circuit board.

16. The integrated circuit system of claim 11, wherein the first and the second MOSFET devices are positioned in parallel to each other.

17. A method for manufacturing an integrated circuit system, comprising:
providing a first MOSFET device electrically connected to a second MOSFET device each disposed on opposite sides of a printed circuit board, and wherein a source electrode pin of the first MOSFET device is aligned to be directly opposite from a source electrode pin of the second MOSFET device; and
providing a third MOSFET device electrically connected to the second MOSFET device disposed on an opposite side where the second MOSFET device is disposed, wherein the second MOSFET device is positioned at a location offset from a center of the first MOSFET device and the third MOSFET device is positioned at a location offset from a center of the second MOSFET device, and wherein the second MOSFET device overlaps an edge of the first MOSFET device and an edge of the third MOSFET device, and wherein a gate electrode pin of the second MOSFET device is aligned to be directly opposite from a gate electrode pin of the third MOSFET device.

18. The method of claim 17, wherein the first MOSFET device is positioned in parallel to the second MOSFET device and the third MOSFET device.

19. The method of claim 17, wherein the source electrode pin of the first MOSFET device is configured to electrically connect to the source electrode pin of the second MOSFET device and the gate electrode pin of the second MOSFET device is configured to electrically connect to the gate electrode pin of the third MOSFET device.

20. The integrated circuit system of claim 1, wherein the printed circuit board comprises:
a gate drive plate electroplated to the printed circuit board that is configured to electrically connect a gate electrode pin of the first MOSFET device, the gate electrode pin of the second MOSFET device, and the gate electrode pin of the third MOSFET device; and
a ground plate electroplated to the printed circuit board that is configured to electrically connect the source electrode pin of the first MOSFET device, the source electrode pin of the second MOSFET device, and a source electrode pin of the third MOSFET device to ground.

* * * * *